(12) United States Patent
Praamsma

(10) Patent No.: US 6,171,912 B1
(45) Date of Patent: Jan. 9, 2001

(54) METHOD OF MANUFACTURING A SEMICONDUCTOR DEVICE COMPRISING A FIELD EFFECT TRANSISTOR

(75) Inventor: Louis Praamsma, Nijmegen (NL)

(73) Assignee: U.S. Philips Corporation, New York, NY (US)

(*) Notice: Under 35 U.S.C. 154(b), the term of this patent shall be extended for 0 days.

(21) Appl. No.: 09/196,067

(22) Filed: Nov. 19, 1998

(30) Foreign Application Priority Data

Nov. 21, 1997 (EP) .................................................. 97203644

(51) Int. Cl.[7] .................................................. H01L 21/336
(52) U.S. Cl. ........................ 438/286; 438/262; 438/307; 438/529; 257/335
(58) Field of Search .................................... 438/197, 301, 438/307, 529, 262, 286, 268; 257/335, 328, 343, 382, 383, 389

(56) References Cited

U.S. PATENT DOCUMENTS

| 3,846,822 | 11/1974 | Riley et al. | 357/23 |
| 4,058,822 * | 11/1977 | Awane et al. | |
| 4,404,576 * | 9/1983 | Romen. | |
| 5,585,660 * | 12/1996 | Mei | 257/389 |
| 5,825,065 * | 10/1998 | Corsi et al. | 257/328 |

* cited by examiner

Primary Examiner—Long Pham
(74) Attorney, Agent, or Firm—Steven R. Biren

(57) ABSTRACT

The invention relates to a method of manufacturing a field effect transistor, in particular a discrete field effect transistor, comprising a source region (1) and a drain region (2) and, between said regions, a channel region (4) above which a gate region (3) is located. The gate region (3) is formed by applying an insulating layer (5) to the semiconductor body and providing this insulating layer with a stepped portion (6) in the thickness direction, whereafter a conductive layer (30) is applied to the surface of the semiconductor body (10), which layer is substantially removed again by etching, so that a part (3A) of the conductive layer (30), which part forms part of the gate region (3) and which lies against the stepped portion (6), remains intact. In a method in accordance with the invention, the source region (1) and the drain region (2) are formed before the insulating layer (5) is provided, and after the provision of the part (3A) of the gate region (3), which part is formed from the conductive layer (30), the surface of the semiconductor body (10) is made flat by applying a further insulating layer (7) next to the stepped portion (6). Such a method enables a T-shaped gate region (3) to be manufactured in a simple manner, said gate region comprising a very short vertical part (3A) of, for example, polycrystalline silicon and an overlying wider horizontal part of, for example, aluminium. Such a transistor has excellent high-frequency properties. In a preferred embodiment, the stepped portion (6) is formed by providing the insulating layer with a recess (8) whose side walls are situated above the source region (1) and the channel region (4). In a particularly simple variant, a "parasitic" gate region (32) is subsequently formed above the source region (1), which is not objectionable. The recess (8) can further be used in the formation of LDMOST whose source region (1) can be provided with an extension (1A).

6 Claims, 3 Drawing Sheets

METHOD OF MANUFACTURING A SEMICONDUCTOR DEVICE COMPRISING A FIELD EFFECT TRANSISTOR

BACKGROUND OF THE INVENTION

The invention relates to a method of manufacturing a semiconductor device comprising a semiconductor body including a field effect transistor, whereby a source region and a drain region are formed in the semiconductor body to form said transistor, and on the semiconductor body a gate region is formed above a channel region situated between the source region and the drain region, said gate region being formed by providing the semiconductor body with an (electrically) insulating layer, which is provided with a stepped portion in the thickness, whereafter the surface of the semiconductor body is provided with a. conductive layer which is removed again by etching, whereby a portion of the conductive layer, which lies against the stepped portion and which forms part of the gate region, remains intact. The invention also relates to a transistor which can be manufactured by such a method. Such a method is particularly suitable for the manufacture of discrete field effect transistors operating at a high frequency and, as in the case of a LDMOST (Lateral Double diffused Metal Oxide Semiconductor Transistor) having a high breakdown voltage. Such discrete field effect transistors can be used in an amplifier or driver stage for TV transmitters operating at a supply voltage of, for example, 28 V.

A method of the type mentioned in the opening paragraph is disclosed in U.S. Pat. No. 3,846,822, published on May 11, 1974. In said document a description is given of a method of manufacturing a DMOS transistor, in which a semiconductor body is provided with an insulating layer having a stepped portion in the thickness, in this case two stepped portions on either side of a strip-shaped mesa formed in the insulating layer. This insulating layer is provided with a conductive tungsten layer, the major part of which is removed again by etching. Making use of the shadow of the strip-shaped mesa, a part of the tungsten layer which is situated against a side face of the mesa is deliberately left intact in this etching operation. Said part forms the gate region of the transistor to be formed. Subsequently, a source region and a drain region of the transistor are formed on either side of the mesa, which serves as a mask. In a similar manner, also a part of the channel region of the transistor, which is situated below the gate region, is provided with a higher doping concentration. Finally, the source, gate and drain regions are provided with electrical connections.

A drawback of the known method is that, notwithstanding the low (electric) resistance of the gate region, also at a very short length, the use of metals proves to be very objectionable in practice. A gate region of polycrystalline silicon does not have these drawbacks and, of itself, also yields better transistors. However, ii is difficult to provide such a gate region with a sufficiently low resistance.

SUMMARY OF THE INVENTION

Therefore, it is an object of the invention to provide a method of manufacturing transistors with an excellent high-frequency behavior and hence a short gate region having a low resistance.

To achieve this, a method of the type mentioned in the opening paragraph is characterized in accordance with the invention in that the source region and the drain region are formed before the application of the insulating layer and after the application of the portion of the gate region formed from the conductive layer, the surface of the semiconductor body being made flat by applying a further insulating layer next to the stepped portion. The invention is based on the realization that in order to provide a very narrow gate region with a sufficiently high conductance, it is desirable to employ a gate region which is built up of two parts: first of all the part formed by the conductive layer, which preferably comprises polycrystalline silicon, and subsequently, an overlying part composed of a different, i.e. better conductor, for example a metal. The invention is further based on the realization that such an upper part of the gate region can be readily embodied so as to be sufficiently wide and well aligned, by making the structure comprising the lower portion of the gate region flat. In accordance with the invention, this is achieved by applying, after the formation of the lower portion of the gate region, a further insulating layer next to the stepped portion. Since the source and the drain are already formed before the insulating layer and the further insulating layer are provided, the stepped portion in the insulating layer does not have to serve as a mask to form the source and the drain. This enables not only a relatively thick (further) insulating layer to be applied but also a different shape and position of the stepped portion with respect to the known method. Also the latter has important advantages, as will be described more fully later.

In a preferred embodiment of a method in accordance with the invention, the stepped portion in the thickness of the insulating layer is formed by providing the insulating layer with a recess a side wall of which is situated above the channel region, thus forming the stepped portion, and another side wall forming a further stepped portion is situated above the source region. Since a recess (or aperture) in the insulating layer only has a local character, the semiconductor body can be readily made flat again after the formation of the portion of the gate region formed from the conductive layer. A recess further enables the transistor structure to be provided with advantageous constructive characteristics. For example, an extension of the source region can be readily formed through the recess, the remaining portion of the insulating layer serving as a mask. The same applies to a local increase of the doping concentration of the channel range, which is necessary for a DMOS transistor.

The choice of a recess in the insulating layer and the position thereof also relates to a further surprising realization which forms part of the invention. When a part of the gate region is formed against a side wall of the recess, a similar region is also formed against the other side wall of the recess. The above-mentioned realization is that, by virtue of the above-mentioned position of said further stepped portion, the removal of this "parasitic" gate region is not necessary because the presence thereof in an electrically insulating layer and above the source region does not have adverse effects.

Preferably, the semiconductor body which is made flat again is provided with another insulating layer in which contact apertures are made. Subsequently, a further conductive layer is provided, and the gate region is formed from this layer and the portion of the conductive layer lying against the stepped portion. In this manner, a gate region is readily formed, which may have, on the one hand, a very short length, i.e. the thickness of the conductive layer, and, on the other hand, a very low conductance, i.e. a conductance which is reduced by the further conductive layer. Preferably, polycrystalline silicon is used as the material for the conductive layer, and for the further conductive layer use is preferably made of a metal, such as aluminium, or a metal silicide, such as titanium silicide, which are materials having a much lower resistivity than polycrystalline silicon and, in addition, they can be used as a connection conductor.

In an attractive variant of a method in accordance with the invention, prior to the application of the conductive layer, a further recess is formed in the insulating layer and, after the application of the conductive layer, the part thereof which is situated in the further recess is masked during etching the conductive layer. Thus this variant enables a transistor having a so-called screening electrode to be obtained in a simple manner. This electrode can be used to preclude or, at least, reduce capacitive feedback from the drain region to the gate region.

Preferably, both the conductive layer and the further insulating layer are provided by means of uniform deposition. The conductive layer is removed again, with the exception of the vertical or screened portions thereof, by means of anisotropic etching, also referred to as dry etching, such as etching by means of a plasma. The semiconductor body is made flat again, preferably, also by anisotropic dry etching.

The invention also relates to a semiconductor device comprising a semiconductor body including a field effect transistor having a source region and a drain region situated in the semiconductor body and a gate region which is situated above a channel region located between the source region and the drain region, said gate region comprising a small strip of a conductive material. In accordance with the invention, the small strip of a conductive material is completely recessed in one or more insulating layers, and a further small strip of the same dimensions and the same composition is situated within the insulating layers above the source region. Such a transistor is excellently suited for the above-mentioned applications and can be readily manufactured by means of a method in accordance with the invention.

Preferably, the gate region of the transistor is T-shaped, whereby the leg comprises the small strip and the arms comprise a further conductive layer situated on the insulating layers. In a favorable variant, the transistor is embodied so as to be a LDMOS transistor.

These and other aspects of the invention will be apparent from and elucidated with reference to the embodiments described hereinafter.

DESCRIPTION OF THE PREFERRED EMBODIMENTS

Figure 1:
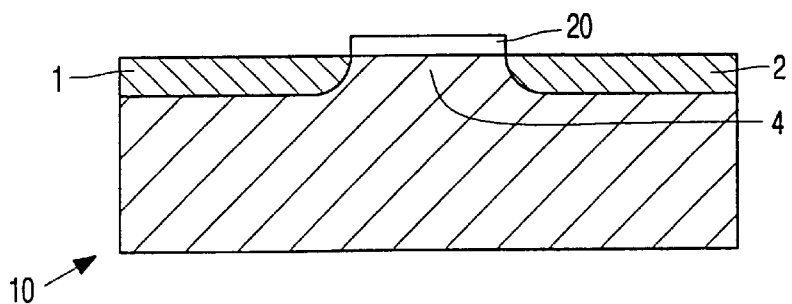
FIGS. 1 through 11 are schematic, cross-sectional views, at right angles to the thickness direction, of a semiconductor device with an LDMOS transistor in successive stages of manufacture by means of a method in accordance with the invention.

The Figures are not drawn to scale and, for clarity, particularly the dimensions in the thickness direction are exaggerated strongly. Like reference numerals refer to like regions, whenever possible, and regions of the same conductivity type are indicated by the same hatching whenever possible.

Figure 2:
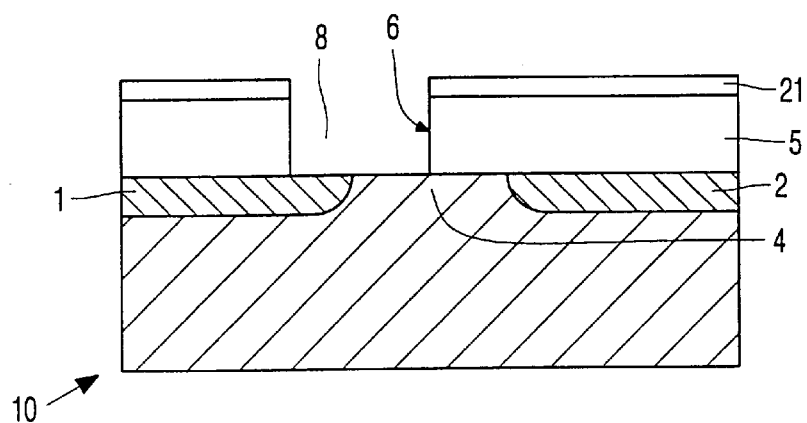
Figure 3:
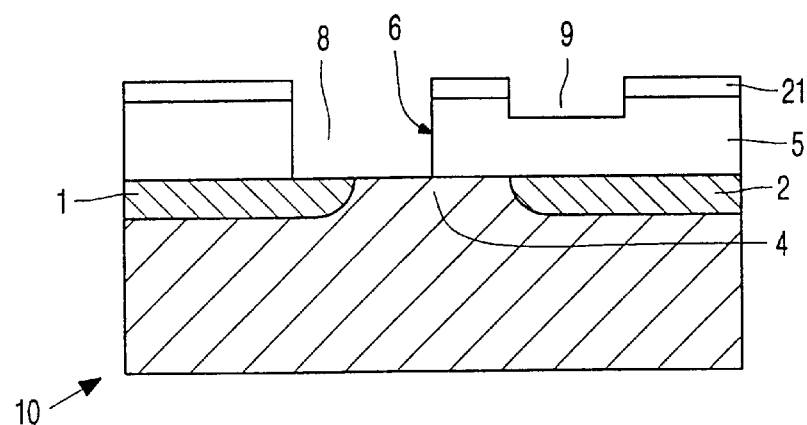
Figure 4:
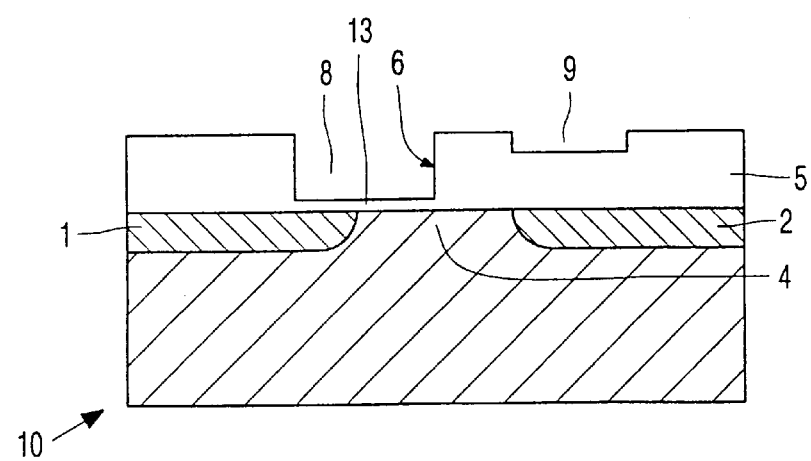
Figure 5:
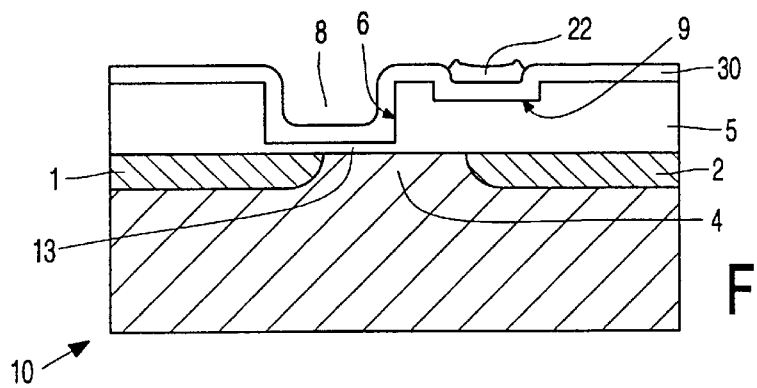
Figure 6:
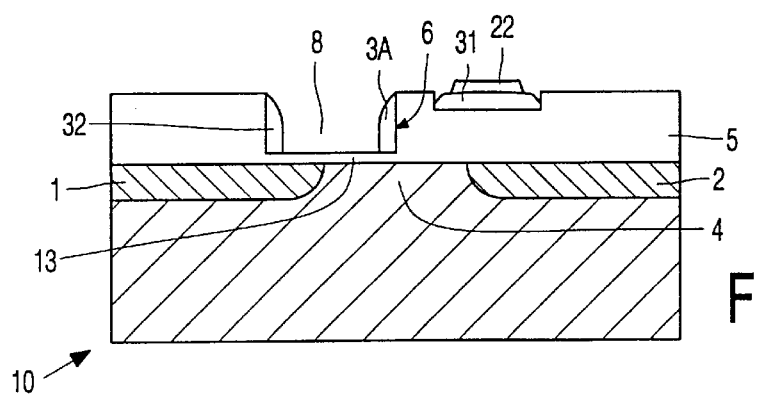
Figure 7:
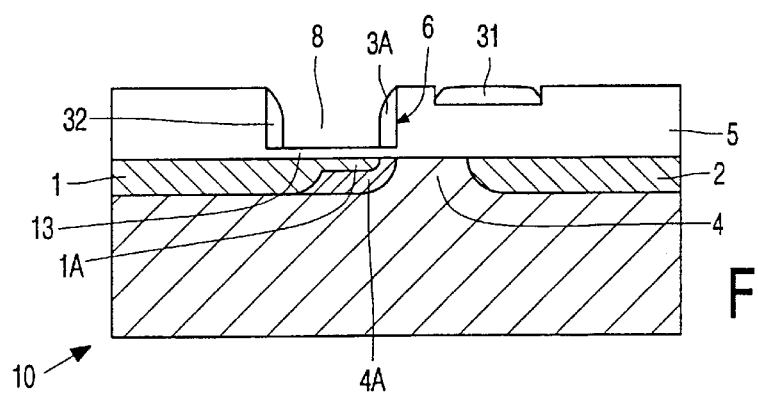
Figure 8:
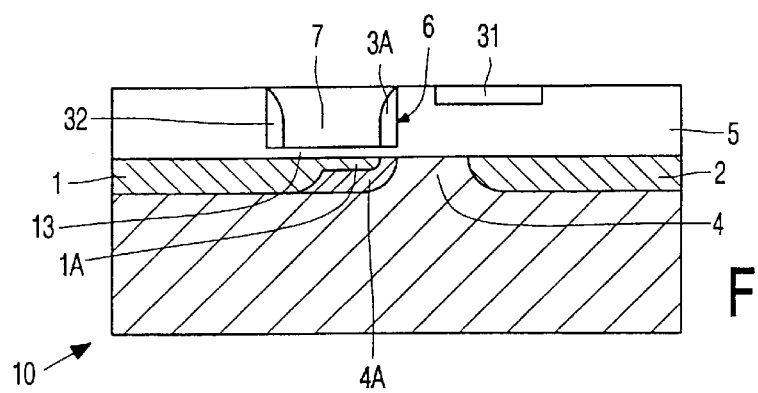
Figure 9:
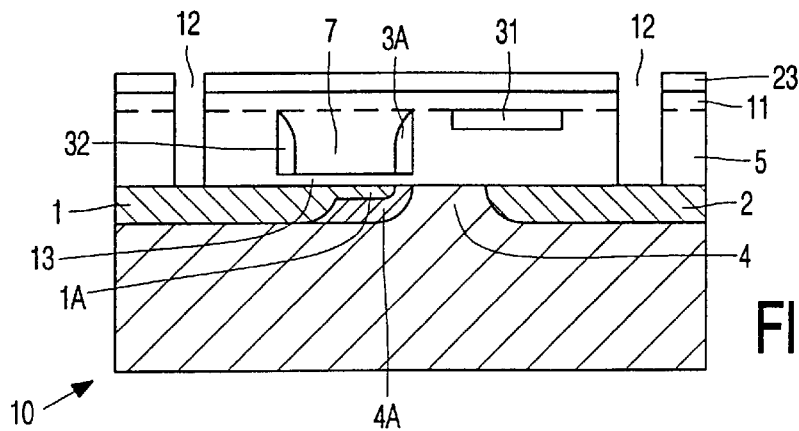
Figure 10:
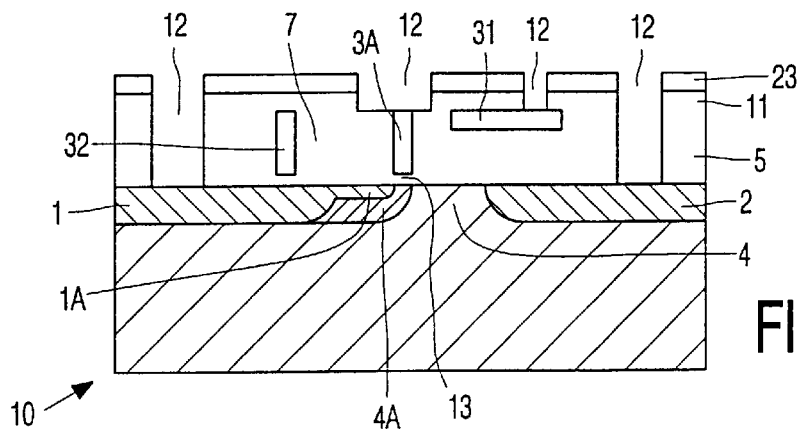
Figure 11:
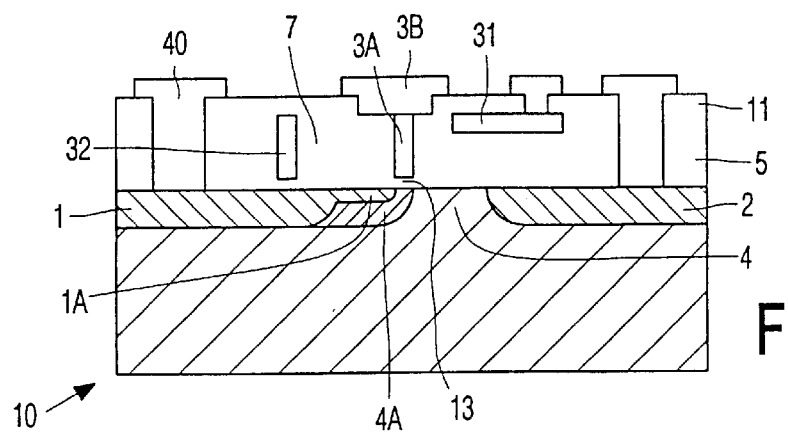

FIGS. 1 through 11 are schematic, cross-sectional views, at right angles to the thickness direction, of a semiconductor device with a LDMOS transistor in successive stages of manufacture by means of a method in accordance with the invention. The finished device (see FIG. 11) comprises a semiconductor body 10, in this case of silicon, with an LDMOS transistor. The transistor comprises a source region 1 of a first conductivity type, in this case n-conductivity, and a drain region 2, which is also of the first conductivity type. Between said regions there is situated a channel region 4, of a second, opposite, conductivity type, i.e. in this case the p-conductivity type. Over the channel region 4, there is situated, in succession, a part 13 of an insulating layer 5, in this case of $SiO_2$, which forms a gate oxide for a gate region 3. The gate region 3 is T-shaped and comprises a narrow strip-shaped part 3A of polycrystalline silicon and a wide, thin part 3B comprising a metal, in this case aluminium. In accordance with the invention, the narrow part 3A of the gate region 3 is completely embedded in one or more insulating layers, in this case in the insulating layer 5 and in another insulating layer 11, and a further narrow strip 32 is situated above the source region 1, said further narrow strip being composed of the same material and having the same dimensions as the part 3A of the gate region 3 within the insulating layers 5, 11, and said narrow strip being separated from the part 3A by a further insulating layer 7.

By virtue of the above-described structure of the gate region 3, the device in accordance with the invention has excellent high-frequency properties, which can be attributed to the short length of the part 3A of the gate region 3 and the low resistance of the part 3B of said gate region. The presence of the "parasitic" gate region 32 does not adversely affect the properties, but instead enables the device to be manufactured in accordance with a very favorable variant of a method in accordance with the invention, which will be described more fully later. Apart from the gate region 3, also the source region 1 and the drain region 2 are provided with electrical connections 40 which, in this case, are also made of aluminium. The same applies to a conductive region 31 buried within the insulating layers 5, 11, which conductive region is, in this case, also made of polycrystalline silicon, and is situated above the drain region 2, where it serves to screen the gate region 3 from the drain region 2.

The above-described device is manufactured in the following manner using a method in accordance with the invention. The semiconductor body (see FIG. 1) is provided with a photoresist strip 20, in this case having a width of 1.4 $\mu$m, which serves as a mask 20 in the formation of the source region 1 and the drain region 2 by means of a phosphor-ion implantation. A channel region 4 is situated between said source and drain regions. After removing the mask 20, (see FIG. 2), a 1.0 $\mu$m thick insulating layer 5 of $SiO_2$ is provided by means of CVD (=Chemical Vapor Deposition), and using a positive photoresist masking layer 21, a recess 8, in this stage an aperture 8 having a width of 1.2 $\mu$m, is formed in said layer 5, a side wall 6 of said aperture being situated above the channel region 4 and another side wall being situated above the source region 1. After a second exposure of the photoresist layer 21, the insulating layer 5 is provided, in this case, with a further recess 9 which is situated above the drain region 2, and which, in this case, has a width of 3.5 $\mu$m. The recess 8 and the further recess 9 are formed, in this case, by means of dry anisotropic etching.

After removing the photoresist layer 21, (see FIG. 5), the semiconductor body 10 is exposed to a thermal oxidation operation in which a 0.02 $\mu$m thick gate oxide 13 is formed on the bottom of the aperture 8. Subsequently, a 0.2 $\mu$m thick, conductive layer 30 of polycrystalline silicon is applied by CVD. This layer is provided, in this example at the location of the further recess 9, with a mask 22 comprising, in this case, a positive photoresist. Subsequently, (see FIG. 6), the major part of the conductive layer 30 is removed again by means of anisotropic etching, in this case dry etching. By virtue of the etching technique used, the parts 3A and 32 of the conductive layer 30, which are situated against the side walls of the recess 8, remain intact. The part 31 of the conductive layer 30 situated in the further recess 9 remains intact by virtue of the mask 22. The vertical parts of the conductive layer 30, which are parallel to the plane of the drawing, connect the part 3A of the gate region 3 to the "parasitic" gate region 32 situated above the source region 1. This is not objectionable. If necessary, it is alternatively possible to remove, or at least interrupt, these parts in a separate process step, for example near the part 3A of the gate region 3.

Subsequently, (see FIG. 7), a deeper, i.e. 0.2 μm deep, boron implantation is performed through the recess 8 in order to provide a part 4A of the channel region 4, which part 4A is situated below an extension 1A to be formed of the source region 1, with a greater doping concentration. Next, a so-called tempering step is carried out in which the implanted ions are rendered electrically active and the higher-doped part 4A of the channel region 4 extends in the thickness direction, and particularly in the lateral direction, as far as necessary. This means that, in the lateral direction, it extends precisely up to and including the part 3A of the gate region 3. Subsequently, a less deep, in this case 0.02 μm deep, phosphor implantation is performed, in which an extension 1A of the source region 1 is formed. Also this implantation is followed by a tempering step. Thus, the transistor to be formed will be a DMOS-type transistor.

Subsequently, (see FIG. 8), the recess 8 is filled with the further insulating layer 7, thus making the semiconductor body 10 flat again. In this example, this is achieved by providing the further insulating layer 7 throughout the surface of the semiconductor body 10 in a thickness such that the recess 8 is at least completely filled. Next, the superfluous parts of the further insulating layer 7 are removed by anisotropic dry etching, resulting in a flat structure.

Next, (see FIG. 9), another insulating layer 11 of SiO$_2$ is applied in a thickness of 0.2 μm by means of CVD. Using a positive photoresist layer 23 as a mask, the semiconductor body 10 is subsequently provided with contact apertures; first of all, two deep apertures 12 extending as far as the source region 1 and the drain region 2 are formed and, subsequently, after a second exposure step (see FIG. 10), two shallow apertures 12 extending as far as the part 3A of the gate region 3 and the screening electrode 31 are formed. Finally, the semiconductor body 10 is provided with a conductive layer 40, in this case of aluminium, to fill the apertures 12, the upper part 3B of the gate region 3 and the electrical connections of the source region 1, drain region 2, gate region 3 and screening electrode 31 being formed from said aluminium conductive layer. In this manner, (see FIG. 11), an LDMOST having excellent high-frequency properties is obtained. The dimensions of the transistor of this example are as follows: the source region 1 and the drain region 2 are 5 μm wide, 500 μm long and 0.2 μm deep. The channel region 4 is 1.4 μm long, the extension 1A of the source region 1 is 0.4 μm long and the length of the higher-doped region 4A is equal to the length of the part 3A of the gate region 3. The screening electrode 31 is 500 μm long and 3.5 μm wide. The dimensions of the metal part 3B of the gate region 3 are 500×2.0 μm$^2$ and the thickness thereof is 1.0 μm.

The invention is not limited to the above example, and within the scope of the invention many modifications and variations are possible to those skilled in the art. For example, thicknesses, (semiconductor) materials or compositions other than those used in the examples can be employed. It is also possible to simultaneously replace all conductivity types by the opposite conductivity type. The techniques used to apply doped semiconducting or conducting regions as well as those used to apply insulating materials can be replaced by other techniques. For example, it is alternatively possible to employ CMP(=Chemical Mechanical Polishing) to make the structure flat again after the provision of the further insulating layer.

The semiconductor body may be formed by a substrate or a substrate provided with an epitaxial layer.

Finally, it is noted that the method is particularly suitable for the manufacture of discrete transistors, although it is not limited thereto. Simple circuits of a few transistors, such as a tetrode or cascode circuit, may also advantageously be manufactured so as to be integrated with each other. The transistor mentioned in the example is a MOSFET-type transistor, however, a MESFET-type transistor can also advantageously be manufactured by means of a method in accordance with the invention.

What is claimed is:

1. A method of manufacturing a semiconductor device comprising a semiconductor body (10) including a field effect transistor, whereby a source region (1) and a drain region (2) are formed in the semiconductor body (10) to form said transistor, and on the semiconductor body (10) a gate region (3) is formed above a channel region situated between the source region (1) and the drain region (2), said gate region (3) being formed by providing the semiconductor body with an insulating layer (5), which is provided with a stepped portion (6) in the thickness, whereafter a surface of the semiconductor body (10) is provided with a conductive layer (30) which is substantially removed by etching, whereby a portion (3A) of the conductive layer (30), which lies against the stepped portion (6) and which forms part of the gate region (3), remains intact, characterized in that the source region (1) and the drain region (2) are formed before the application of the insulating layer (5), and after the application of the portion (3A) of the gate region (3) formed from the conductive layer (30), the surface of the semiconductor body (10) is made flat by applying a further insulating layer (7) next to the stepped portion (6), and in that the stepped portion (6) in the thickness of the insulating layer (5) is formed by providing the insulating layer (5) with a recess (8), a side wall (6) of which is situated above the channel region (4), thus forming the stepped portion, and another side wall forming a further stepped portion is situated above the source region (1).

2. A method as claimed in claim 1, characterized in that prior to the application of the conductive layer (30), a further recess (9) is formed in the insulating layer (5), and after the application of the conductive layer (30), a part (31) of the conductive layer which is situated in the further recess (9) is masked during etching the conductive layer (30).

3. A method as claimed in claim 1, characterized in that the surface of the flattened semiconductor body (10) is provided with another insulating layer (11), the surface of the semiconductor body (10) is provided with contact apertures (12) over which a further conductive layer (40) is provided, and from a part (3B) of said conductive layer and a part of the conductive layer (30) lying against the stepped portion (6), the gate region (3) is formed.

4. A method as claimed in claim 3, characterized in that the conductive layer (30) is made from polycrystalline silicon, and the further conductive layer (40) is made from metal and is, preferably, also used to form electrical connections (40) of the source region (1), the drain region (2) and the part (31) of the conductive layer (30) situated in the further recess (9).

5. A method as claimed in claim 1, characterized in that the insulating layer (5) provided with a stepped portion (6) is used as a mask in the manufacture of a shallow extension (1A) of the source region (1) and in providing a part (4A) of a channel range (4) situated around the shallow extension (1A) of the source region (1) with a higher doping.

6. A method as claimed in claim 1, characterized in that, after its provision, the major part of the conductive layer (30) is removed by anisotropic etching, and the surface of the semiconductor body (10) is made flat again by providing the further insulating layer (7) throughout the surface of the semiconductor body (10) and, subsequently, removing said further insulation layer down to the insulating layer (5) by means of anisotropic dry etching.

* * * * *